United States Patent
Kim et al.

(10) Patent No.: US 8,422,248 B2
(45) Date of Patent: *Apr. 16, 2013

(54) ELECTROMAGNETIC BANDGAP STRUCTURE AND PRINTED CIRCUIT BOARD

(75) Inventors: Han Kim, Yongin-si (KR); Jae-Joon Lee, Suwon-si (KR); Mi-Ja Han, Jeonju-si (KR); Dae-Hyun Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/137,504

(22) Filed: Aug. 22, 2011

(65) Prior Publication Data

US 2011/0303452 A1     Dec. 15, 2011

Related U.S. Application Data

(62) Division of application No. 12/010,872, filed on Jan. 30, 2008, now Pat. No. 8,035,991.

(30) Foreign Application Priority Data

Feb. 1, 2007   (KR) .................. 10-2007-0010364
Sep. 17, 2007  (KR) .................. 10-2007-0093956

(51) Int. Cl.
  *H05K 9/00*  (2006.01)
(52) U.S. Cl.
  USPC ............ 361/818; 361/794; 361/795; 361/800
(58) Field of Classification Search .................. 361/794, 361/795, 800, 816, 818, 799, 803; 343/908, 343/909, 911 R, 841, 842, 700 MS, 770, 343/767, 748, 708, 810–822, 824

See application file for complete search history.

(56) References Cited

U.S. PATENT DOCUMENTS

| | | | |
|---|---|---|---|
| 4,494,083 A | 1/1985 | Josefsson et al. | |
| 5,889,314 A * | 3/1999 | Hirabayashi | 257/508 |
| 7,154,356 B2 * | 12/2006 | Brunette et al. | 333/33 |

(Continued)

FOREIGN PATENT DOCUMENTS

| | | |
|---|---|---|
| JP | 7-263908 | 10/1995 |
| JP | 2005-340577 | 12/2005 |
| JP | 2006-278553 | 10/2006 |
| JP | 2006-286842 | 10/2006 |
| JP | 2006-351885 | 12/2006 |
| WO | WO2006/016586 | 2/2006 |

OTHER PUBLICATIONS

German Office Action issued Jun. 23, 2009 in corresponding German Patent Application No. 10 2008 006 129.8.

(Continued)

*Primary Examiner* — Hoa C Nguyen

(57) ABSTRACT

An electromagnetic bandgap structure, including: a first metal layer; a first dielectric layer, stacked in the first metal layer; a metal plate, stacked in the first dielectric layer; a via, having one end part which is connected to the first metal layer; a second dielectric layer, stacked in the metal plate and the first dielectric layer; and a second metal layer, stacked in the second dielectric layer, whereas the other end part of the via is connected to a via land which is placed in a hole formed in the metal plate, and the via land is connected to the metal plate through a metal line.

6 Claims, 14 Drawing Sheets

U.S. PATENT DOCUMENTS

| | | |
|---|---|---|
| 2005/0104678 A1 | 5/2005 | Shahparnia et al. |
| 2005/0134522 A1 | 6/2005 | Waltho |
| 2005/0205292 A1 | 9/2005 | Rogers et al. |
| 2005/0247482 A1 | 11/2005 | Nakamura |
| 2007/0001926 A1 | 1/2007 | Waltho |
| 2007/0075903 A1 | 4/2007 | Matsugatani et al. |
| 2007/0120223 A1 | 5/2007 | McKinzie et al. |
| 2007/0285318 A1 | 12/2007 | Sotoudeh et al. |
| 2010/0039343 A1 | 2/2010 | Uno et al. |

OTHER PUBLICATIONS

Japanese Office Action issued Apr. 27, 2010 in corresponding Japanese Patent Application No. 2008-012868.0

Japanese Office Action issued Jan. 25, 2011 in corresponding Japanese Patent Application No. 2008-012868.

U.S. Patent Restriction Requirement mailed Aug. 4, 2010 in corresponding U.S. Appl. No. 12/010,872.

U.S. Patent Office Action mailed Oct. 15, 2010 in corresponding U.S. Appl. No. 12/010,872.

U.S. Patent Final Office Action mailed Feb. 10, 2011 in corresponding U.S. Appl. No. 12/010,872.

U.S. Patent Advisory Action mailed May 18, 2011 in corresponding U.S. Appl. No. 12/010,872.

U.S. Patent Notice of Allowance mailed Jun. 13, 2011 in corresponding U.S. Appl. No. 12/010,872.

U.S. Appl. No. 12/010,872, filed Jan. 30, 2008, Han Kim et al., Samsung Electro-Mechanics Co., Ltd.

* cited by examiner

ELECTROMAGNETIC BANDGAP STRUCTURE AND PRINTED CIRCUIT BOARD

CROSS-REFERENCE TO RELATED APPLICATIONS

This application is a U.S. divisional application filed under 37 CFR 1.53(b) claiming priority benefit of U.S. Ser. No. 12/010,872 filed in the United States on Jan. 30, 2008 now U.S. Pat. No. 8,035,991, which claims earlier priority benefit to Korean Patent Application No. 10-2007-0010364 filed with the Korean Intellectual Property Office on Feb. 1, 2007, and Korean Patent Application No. 2007-0093956 filed with the Korean Intellectual Property Office on Sep. 17, 2007, the disclosures of which are incorporated herein by reference.

BACKGROUND

1. Field

The present invention relates to a printed circuit board, more specifically to a printed circuit board that can solve a mixed signal problem between an analog circuit and a digital circuit.

2. Description of the Related Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-layered printed circuit board is illustrated, various printed circuit boards such as 2 and 6-layered printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

The decoupling capacitor method, which is a typical solution for power noise, is not adequate for high frequencies. Accordingly, it is necessary to intercept or decrease the noise of the high frequencies between the RF circuit 140 and the digital circuit 130.

FIG. 2 is a sectional view showing an electromagnetic bandgap structure that solves a problem mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function preventing a signal having a certain frequency band from being penetrated, which is based on resistance RE and RP, inductance LE and LP, capacitance CE, CP and CG and conductance GP and GE, is approximated to the equivalent circuit shown in FIG. 5.

A mobile communication terminal is a good example for an electronic apparatus employing the board realized with the digital circuit and the RF circuit together. In the case of the mobile communication terminal, solving the problem mixed signals needs the noise shielding of an operation frequency band of the RF circuit between 0.8 and 2.0 GHz. The small sized mushroom type structure is also required. However, the foregoing electromagnetic bandgap structure may not satisfy the two conditions needed to solve the problem mixed signals.

The reduced size of the mushroom type structure results in the increase of the bandgap frequency to block pertinent noise, to thereby bring about inefficient operation in the frequency band of 0.8 to 2.0 GHz, which is the operation frequency band of the RF circuit in the foresaid mobile communication terminal.

SUMMARY

Accordingly, the present invention provides an electromagnetic bandgap structure and a printed circuit board that can be not only miniaturized but also have a low bandgap frequency.

The present invention also provides an electromagnetic bandgap structure and a printed circuit board that can solve a problem mixed signals in an electronic apparatus (e.g. a mobile communication terminal) employing the board having the digital circuit and the RF circuit, realized therein together.

The present invention provides an electromagnetic bandgap structure and a printed circuit board that can allow the noise of a particular frequency not to be penetrated.

An aspect of present invention features an electromagnetic bandgap structure that can prevent a signal having a frequency band from being transferred.

According to an embodiment of the present invention, the electromagnetic bandgap structure in which a first metal layer, a dielectric layer, a second dielectric layer and a second metal layer are stacked can include a first metal plate, formed between the first dielectric layer and the second dielectric layer; a second metal plate, formed on a same planar surface as the first metal plate, accommodated into a hole which is formed in the first metal plate and electrically connected to the first metal plate through a metal line; and a via, connecting the second metal plate to any one of the first metal layer and the second metal layer.

Here, the metal line can be formed on a same planar surface as the first metal plate and the second metal plate.

Also, the first metal plate can be away from the second metal plate at a predetermined interval.

The metal line can have a straight-line shape or a curved shape. Alternatively, the metal line can have a spiral shape enveloping the second metal plate.

According to another embodiment of the present invention, an electromagnetic bandgap structure can include a first metal layer; a first dielectric layer, stacked in the first metal layer; a metal plate, stacked in the first dielectric layer; a via, having one end part which is connected to the first metal layer; a second dielectric layer, stacked in the metal plate and the first dielectric layer; and a second metal layer, stacked in the second dielectric layer. Here, the other end part of the via can be connected to a via land which is placed in a hole formed in the metal plate, and the via land can be connected to the metal plate through a metal line.

Another aspect of present invention features a printed circuit board that can prevent a signal having a frequency band from being transferred by having an analog circuit and a digital circuit.

According to an embodiment of the present invention, a printed circuit board can include an electromagnetic bandgap structure which is disposed between the analog circuit and the digital circuit, the electromagnetic bandgap structure including a first metal plate, formed between the first dielectric layer and the second dielectric layer; a second metal plate, formed on a same planar surface as the first metal plate, accommodated into a hole which is formed in the first metal plate and electrically connected to the first metal plate through a metal line; and a via, connecting the second metal plate to any one of the first metal layer and the second metal layer.

Here, the first metal layer can be any one of a ground layer and a power layer, and the second metal layer can be the other.

The analog circuit can be an RF circuit including an antenna receiving a wireless signal from an outside.

The metal line can be formed on a same planar surface as the first metal plate and the second metal plate.

Also, the first metal plate can be away from the second metal plate in a predetermined interval.

The metal line can have a straight-line shape or a curved shape. Alternatively, the metal line can have a spiral shape enveloping the second metal plate.

A plurality of electromagnetic bandgap structures can be arranged between the analog circuit and the digital circuit.

According to an embodiment of the present invention, the printed circuit board can include an electromagnetic bandgap structure which is disposed between the analog circuit and the digital circuit, the electromagnetic bandgap structure including a first metal layer; a first dielectric layer, stacked in the first metal layer; a metal plate, stacked in the first dielectric layer; a via, having one end part which is connected to the first metal layer; a second dielectric layer, stacked in the metal plate and the first dielectric layer; and a second metal layer, stacked in the second dielectric layer. Here, the other end part of the via can be connected to a via land which is placed in a hole formed in the metal plate, and the via land can be connected to the metal plate through a metal line.

The first metal layer can be any one of a ground layer and a power layer, and the second metal layer is the other. The analog circuit can be an RF circuit including an antenna receiving a wireless signal from an outside. The metal line can have a straight-line shape, a curved shape or a spiral shape.

BRIEF DESCRIPTION OF THE DRAWINGS

These and other features, aspects and advantages of the present invention will become better understood with regard to the following description, appended Claims and accompanying drawings where:

DESCRIPTION OF EMBODIMENTS

Figure 1:
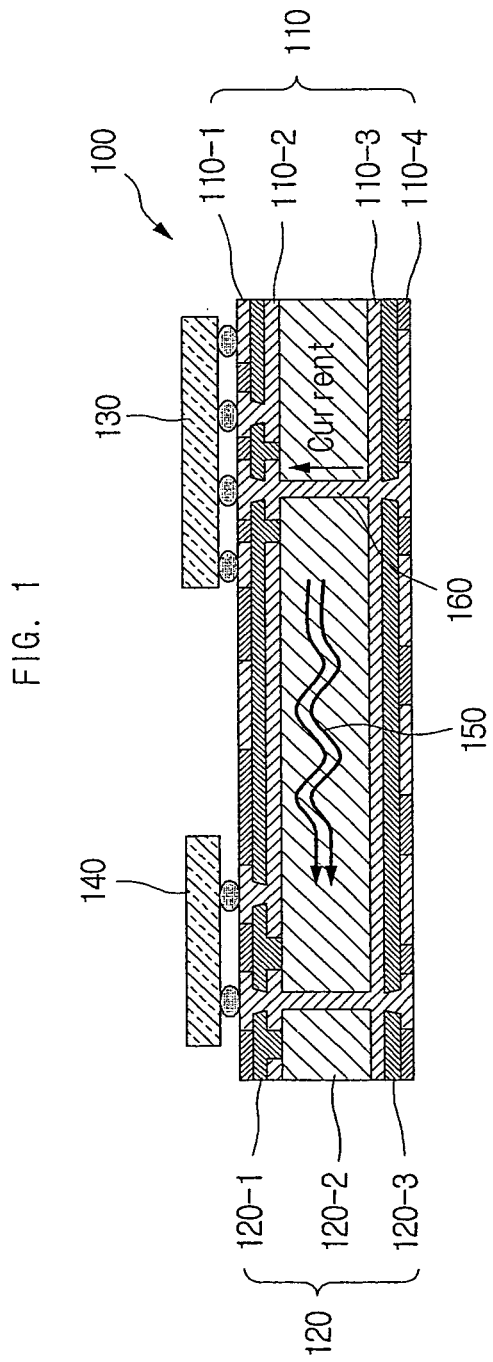
FIG. 1 is a sectional view showing a printed circuit board including analog circuit and a digital circuit.
Figure 2:
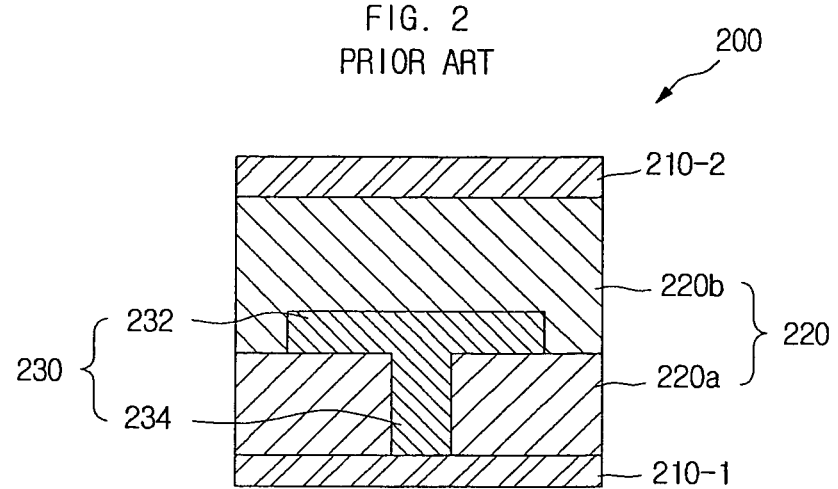
FIG. 2 is a sectional view showing an electromagnetic bandgap structure that solves a problem mixed signals between an analog circuit and a digital circuit in accordance with a conventional art.
Figure 3:
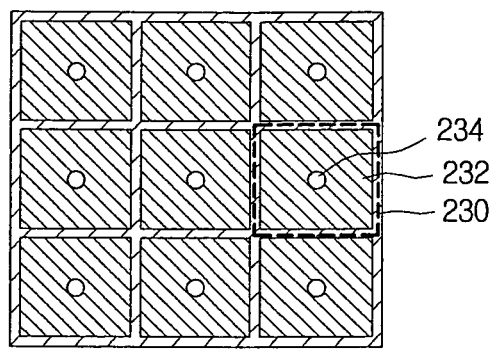
FIG. 3 is a plan view showing a metal plate configuration of the electromagnetic bandgap structure shown in FIG. 2.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 6:
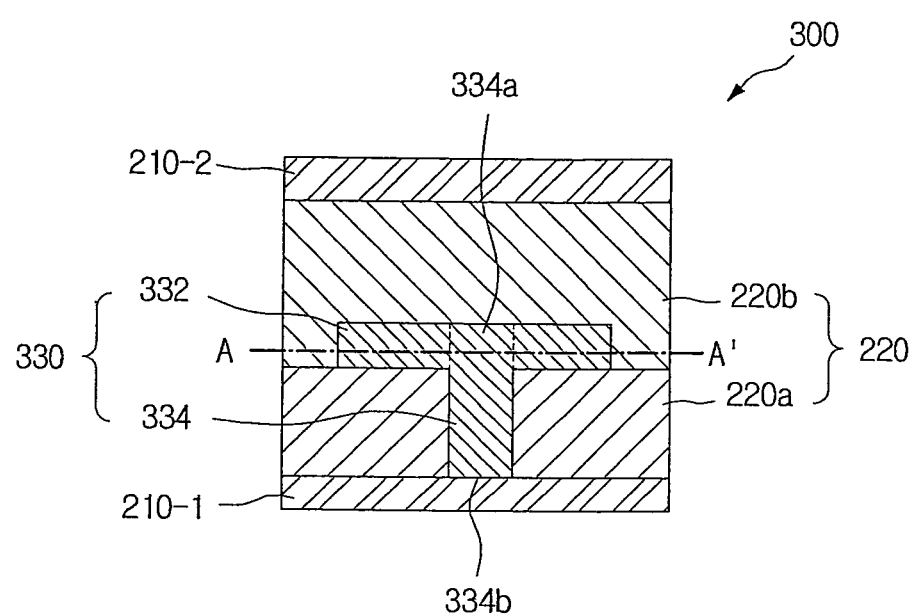
FIG. 6 is a sectional view showing an electromagnetic bandgap structure which solves a mixed signal problem between an analog circuit and a digital circuit.
Figure 7:
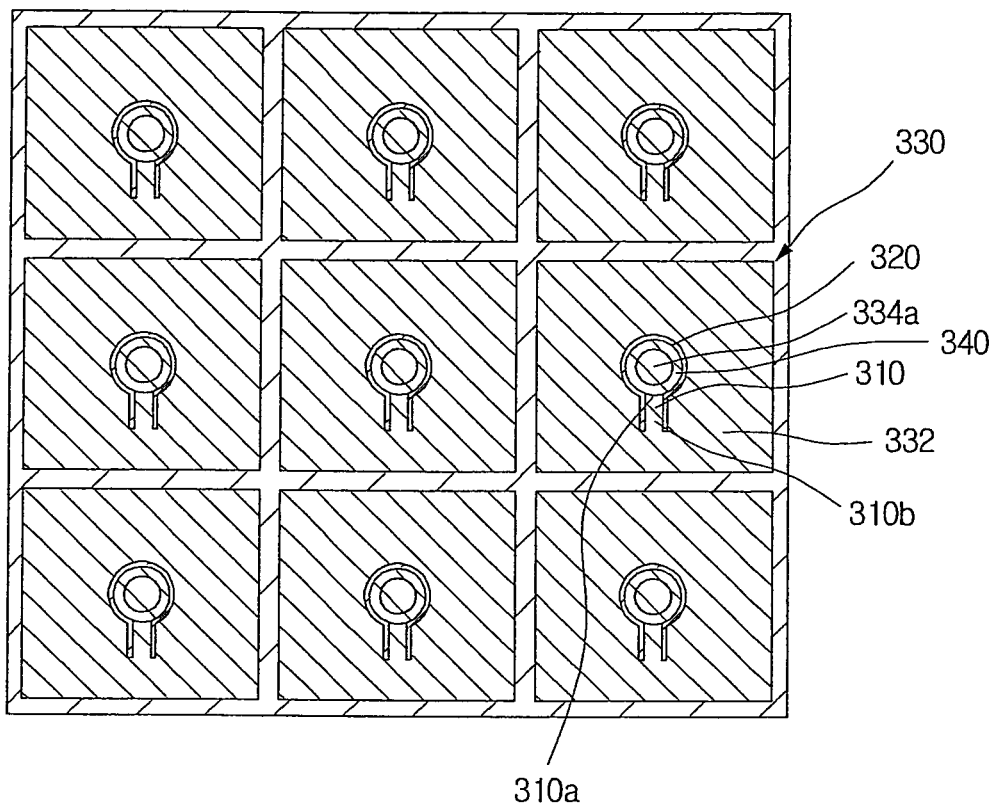
FIG. 7 is a plan view metal plate configuration of the electromagnetic bandgap structure according to the A-A' line of FIG. 6.
Figure 8:
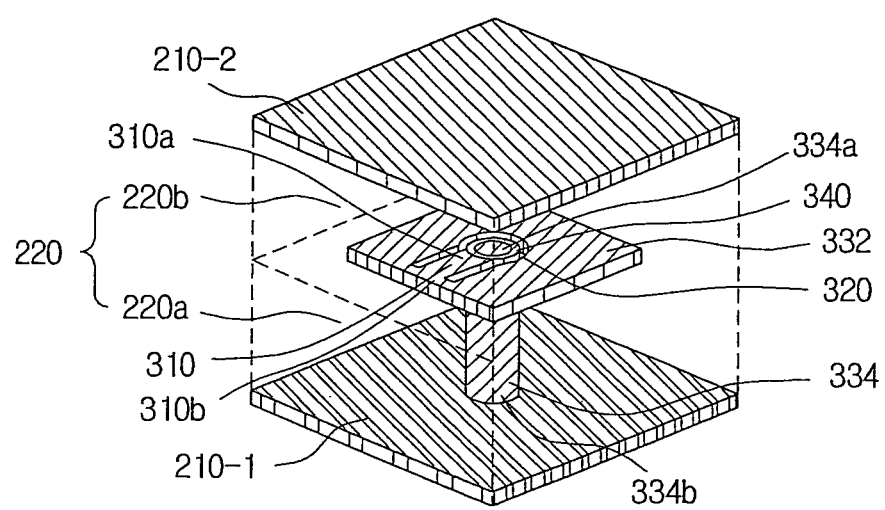
FIG. 8 is a perspective view showing the electromagnetic bandgap structure shown in FIG. 6.

FIG. 6 is a sectional view showing an electromagnetic bandgap structure which solves a mixed signal problem between an analog circuit and a digital circuit, and FIG. 7 is a plan view metal plate configuration of the electromagnetic bandgap structure according to the A-A' line of FIG. 6. FIG. 8 is a perspective view showing the electromagnetic bandgap structure shown in FIG. 6.

In FIG. 6 are illustrated the sectional view showing the electromagnetic bandgap structure 300 including a first metal layer 210-1, a second metal layer 210-2, a first dielectric layer 220a, a second dielectric layer 220b, a metal plate 332 and a via 334.

The first metal layer 210-1 and the metal plate 332 can be connected through the via 334. A dielectric layer 220 can be stacked in between the first metal layer 210-1 and the second metal layer 210-2. The dielectric layer 220 can be distinguished into the first dielectric layer 220a and the second dielectric layer 220b according to their formation time. Here, the metal plate 332 can be placed between the first dielectric layer 220a and the second dielectric layer 220b.

The first metal layer 210-1, the second metal layer 210-2, the metal plate 332 and the via 334 can consist of a metal material (e.g. copper) capable of being provided with an electric power and transferred to a signal.

The first dielectric layer 220a and the second dielectric layer 220b can consist of the same dielectric material, but alternatively, the dielectric layer 220a and 220b can consist of materials having different dielectric constants from each other.

If the first meal layer 210-1 is a ground layer, the second metal layer 210-2 is a power layer. Also, if the first metal 210-1 is the power layer, the second layer 210-2 is the ground layer. In other words, the first metal layer 210-1 and the second metal layer 210-2 can be each one of the ground layer and the power layer, which are placed close to each other, and the dielectric layer 220 can be placed between the ground layer and the power layer.

Even though FIG. 7 illustrate the metal plate 332 having a regular square shape, the metal plate 332 can have various other shapes such as polygon, circles and ellipses.

The metal plate 332 can be formed with a hole 320. The via 334 can be placed in the hole 320. The via 334 and the metal plate 332 can be connected through a metal line 310 (refer to FIG. 7 and FIG. 8).

The method of forming the via 334 will be described as follows.

The first metal layer 210-1, the first dielectric layer 220a and the metal plate 332 can be successively stacked in. A via land 340 can be formed at a position in the metal plate 332. Here, the position of the metal plate 332 can be the position in which the via 334 is desired to be formed for the electrical connection to the first metal layer 210-1. The via land 340, which is to reduce the position error in the drilling process for forming the via 334, can be formed more largely than the sectional area size of the via 334.

The via land 340 can be formed in the hole 320 penetrating the metal plate 332. The via land 340 and the hole 320 can formed by the typical processes of manufacturing the printed circuit board such as masking, exposure, etching and development before the metal plate 332 is formed or simultaneously when the metal plate 332 is formed.

Also, the via 334 penetrating the via land 340 and the first dielectric layer 220 can be formed through the drilling process. Alternatively, the via 334 penetrating the via land 340, the first dielectric layer 220 and the first metal layer 210-1 can be formed the drilling process.

After the via 334 is formed, the plating process can be performed to allow a plating layer to be formed on the inside wall of the via 334 in order to electrically connect the first metal layer 210-1 to the via land 340. According to the plating process, a plating layer can be formed on the inside wall of the via 334 excluding the center part among the inside part of the via 334. Alternatively, the entire inside part of the via 334 can be completely filled. In case that the inside part of the via 334 has an empty center part, the empty center part can be filled with the dielectric material or air. Since the formation of the via 334 is evident to any person of ordinary skill in the art, the pertinent detailed description will be omitted.

The via 334 can have one end part 334b, which is connected to the first metal layer 210-1, and the other end part 334a, which is connected to the via land 340 placed in the hole 320 that is formed in the metal plate 332. The metal line 310 can have one end part 310a, which is connected to the via land 340, and the other end part, which is connected to the metal plate 332.

The metal line 310 can be placed on the same planar surface as the metal plate 332. Also, the metal line 310 and the metal plate 332 can be simultaneously formed at the same step among the processes of manufacturing the electromagnetic bandgap structure 330.

As shown in FIG. 7 and FIG. 8, the metal line 310 can have the shape of straight line. Alternatively, the metal line 310 can have various other shapes such as a curve and a spiral.

The hole 320 can be away from the via land 340 that is connected to the other end part 334a of the via 334 at a predetermined interval. Also, the inside wall of the hole 320 can be away from the parts of the metal line 320 excluding a part connected to the metal plate 332 at a predetermined interval.

At least one mushroom type structure 330 including the metal plate 332 and the via 334 can be formed between the first metal layer 210-1 and the second metal layer 210-2.

The metal plate 332 of the mushroom type structure 330 can be arranged on the same planar surface or the different planar surface between the first metal layer 210-1 and the second metal layer 210-2. Also, even though FIG. 6 illustrates that the via 334 of the mushroom type structure 330 is connected to the first metal layer 210-1, the via 334 of the mushroom type structure 330 can be connected to the second metal layer 210-2.

Also, a plurality of mushroom type structures 330 can be connected to the first metal layer 210-1 or the second metal layer 210-2 through the via 334. Alternatively, some of the mushroom type structures 330 can be connected to the first metal layer 210-1, and the others can be connected to the second layer 210-2.

FIG. 7 illustrates the structure in which the mushroom type structures 330 is away from each other at predetermined intervals and be repeatedly arranged. The repeated formation of the mushroom type structures 330 can make it possible to block a signal having a frequency band corresponding to an operation frequency band of an analog circuit (e.g. an RF circuit) among an electromagnetic wave proceeding from a digital circuit to the analog circuit.

By forming the structure of the metal plate 332 connected to the via 334 in the mushroom type structure 330 as shown in FIG. 6 through FIG. 8, the capacitance value CE between the metal plate 332 and the second metal layer 210-2 can be reduced negligibly. Also, the inductance value LE to be connected in series between the metal plate 332 and the first metal layer 210-1 in accordance with the via 334 can be acquired enough.

Accordingly, in spite of the miniaturized size of the mushroom type structure 330, the bandgap frequency band can be lowered instead of being raised. The bandgap frequency can refer to the frequency prevented from being transferred among the frequencies transferred from a side to another side. In the embodiment of the present invention, the bandgap frequency band can correspond to 0.8 to 2.0 GHz, which is the operation frequency band in the RF circuit of the mobile communication terminal.

Figure 9:
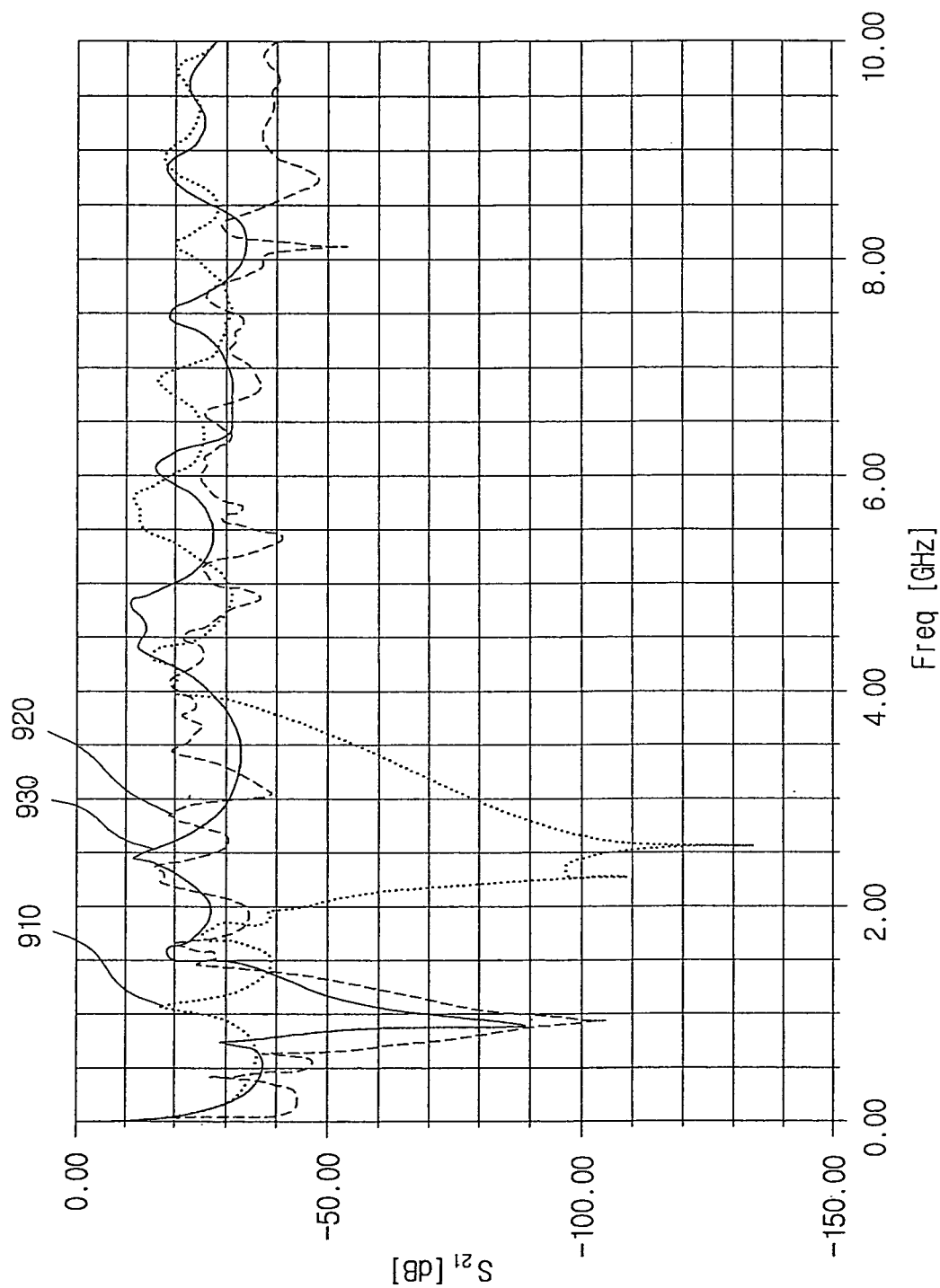
FIG. 9 is graphs showing results that are computer-simulated by using electromagnetic bandgap structures in accordance with a conventional art and an embodiment of the present invention.

FIG. 9 is graphs showing results that are computer-simulated by using electromagnetic bandgap structures in accordance with a conventional art and an embodiment of the present invention.

FIG. 9 illustrates the conventional electromagnetic bandgap structure (i.e. the metal plate 232) having the size of 49 mm² (7×7) (referring to 910) and the conventional electromagnetic bandgap structure (i.e. the metal plate 232) having the size of 324 mm² (18×18) (referring to 920).

If the structure has the size of 49 mm² (7×7) (referring to 910), the frequency having the noise level of (−) 50 dB or lower is 2.0 to 3.6 GHz, and the bandgap frequency, which is the center frequency, can be 2.8 GHz.

If the structure has the size of 324 mm² (18×18) (referring to 920), the frequency having the noise level of (−) 50 dB or lower is 0.7 to 1.3 GHz, and the bandgap frequency, which is the center frequency, can be 1.0 GHz.

In other words, in accordance with the conventional electromagnetic bandgap structure 200, if the bandgap frequency is placed in the band between 0.8 and 1.0 GHz, which is the operation frequency of the RF circuit used in the mobile communication terminal, it is necessary that the structure has the size of 324 mm² (18×18) (referring to 920).

However, in accordance with the electromagnetic structure 300 according to an embodiment of the present invention, if the structure has the size of 49 mm² (7×7) (referring to 930), the frequency having the noise level of (−) 50 dB or lower can be 0.8 to 1.2 GHz, and the bandgap frequency, which is the center frequency, can be 1.0 GHz.

This can be charted as shown in the following table 1.

TABLE 1

Figure 4:
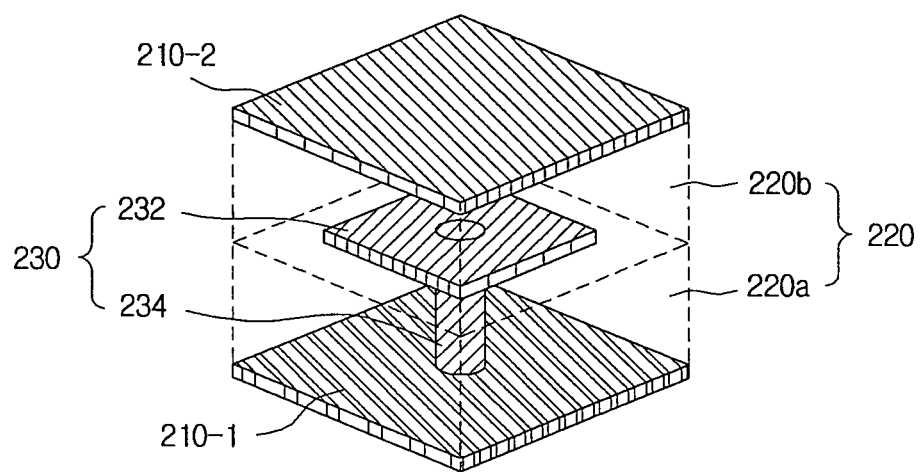
FIG. 4 is a perspective view showing the electromagnetic bandgap structure shown in FIG. 2.
Figure 5:
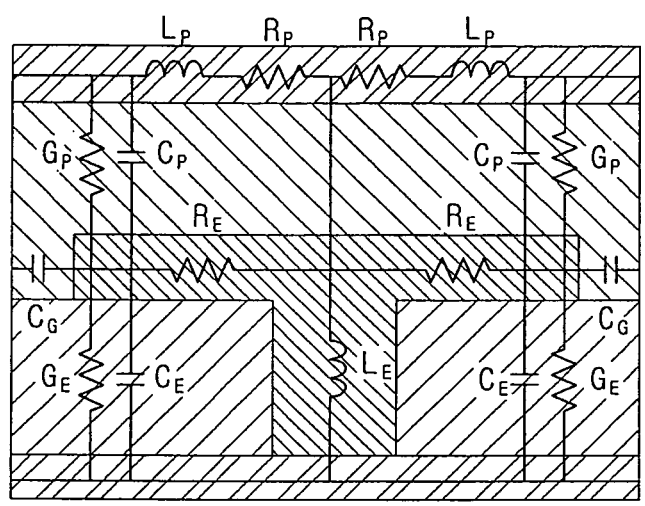
FIG. 5 is a schematic view showing an equivalent circuit of the electromagnetic bandgap structure shown in FIG. 2.

|  | Bandgap frequency | Structure size | Noise level |
| --- | --- | --- | --- |
| Conventional structure (shown in FIG. 4) | 2.8 GHz | 49 mm²(7 × 7) | (−) 50 dB |
|  | 1 GHz | 324 mm²(18 × 18) | (−) 50 dB |
| Structure of invention (shown in FIG. 8) | 1 GHz | 49 mm²(7 × 7) | (−) 50 dB |

In other words, it can be recognized that the electromagnetic bandgap structure 300 accordance with an embodiment of the present invention is able to not only have the same bandgap frequency as the conventional electromagnetic bandgap structure 200 but also lower the structure size by ⅙ or more (i.e. 324 mm²→49 mm²).

Also, in the case of having the same structure size, it can be recognized that the bandgap frequency is lowered by ⅓ or more (i.e. 2.8 GHz→1 GHz).

Figure 10:
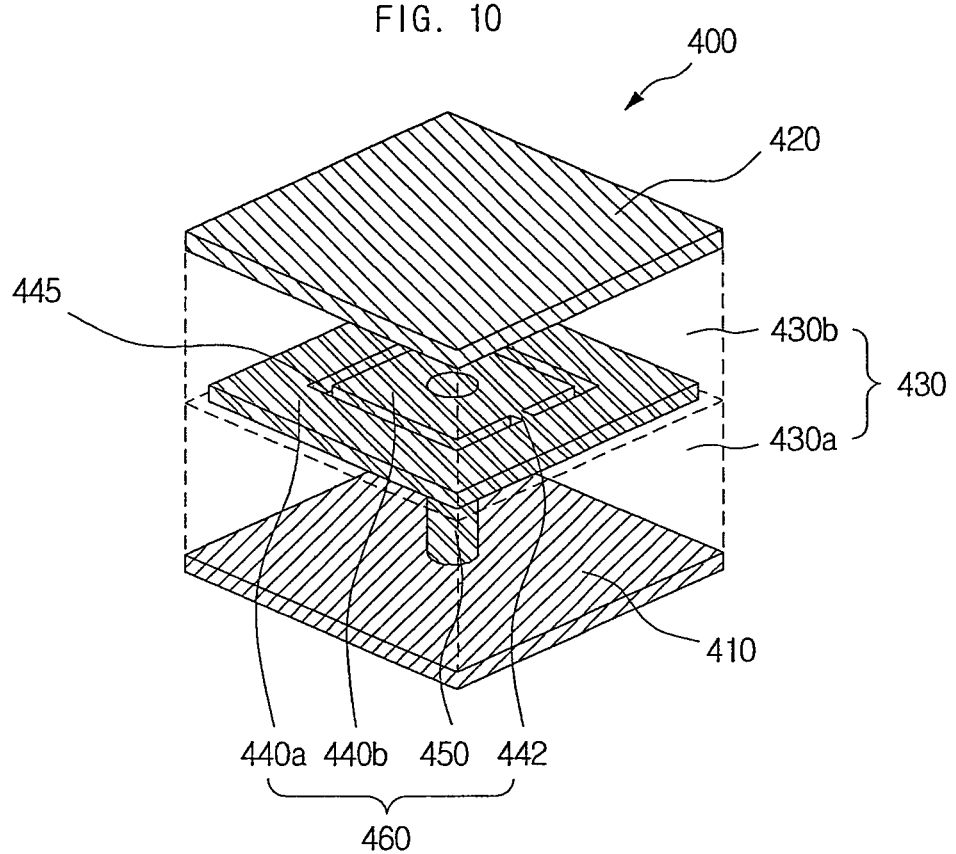
FIG. 10 is a 3-D perspective view showing an electromagnetic bandgap structure in accordance with another embodiment of the present invention.
Figure 11:
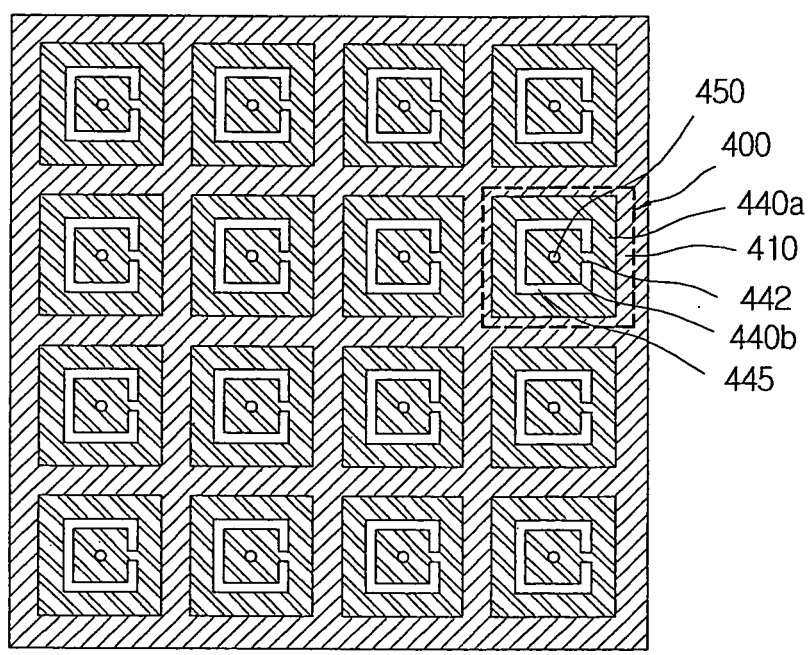
FIG. 11 is a plan view showing the structure in which a plurality of metal plates of the electromagnetic bandgap structure shown in FIG. 10 are arranged.
Figure 12:
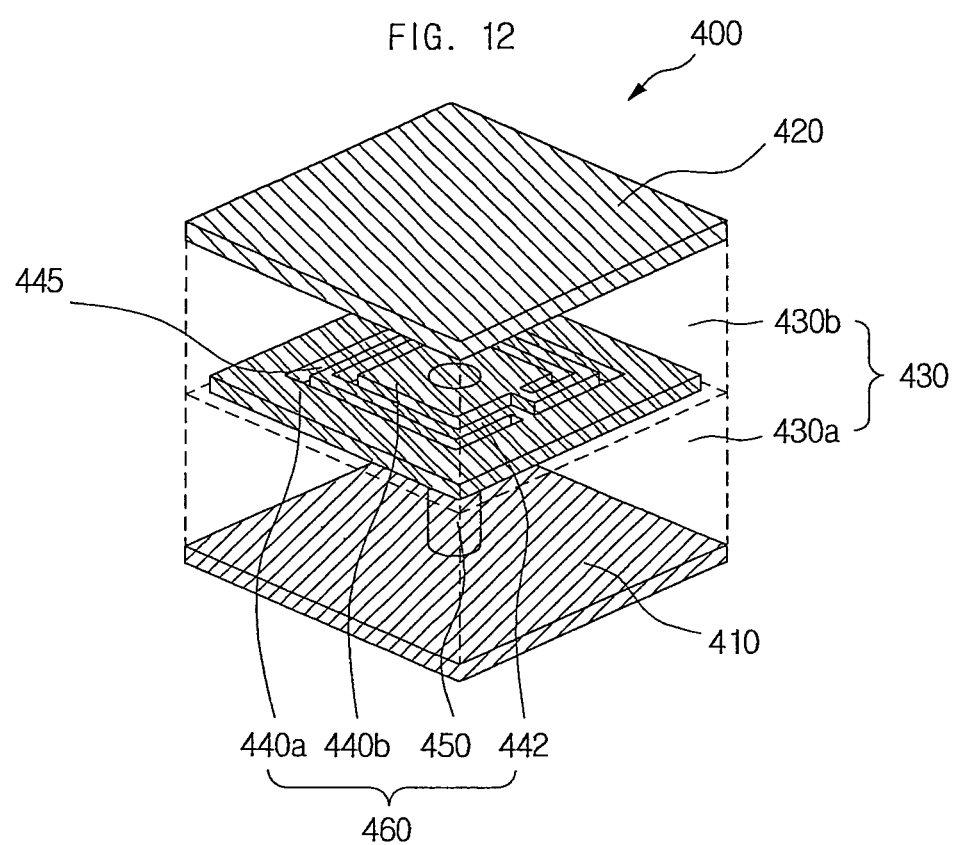
FIG. 12 is a 3-D perspective view showing an electromagnetic bandgap structure in accordance with another embodiment of the present invention.
Figure 13:
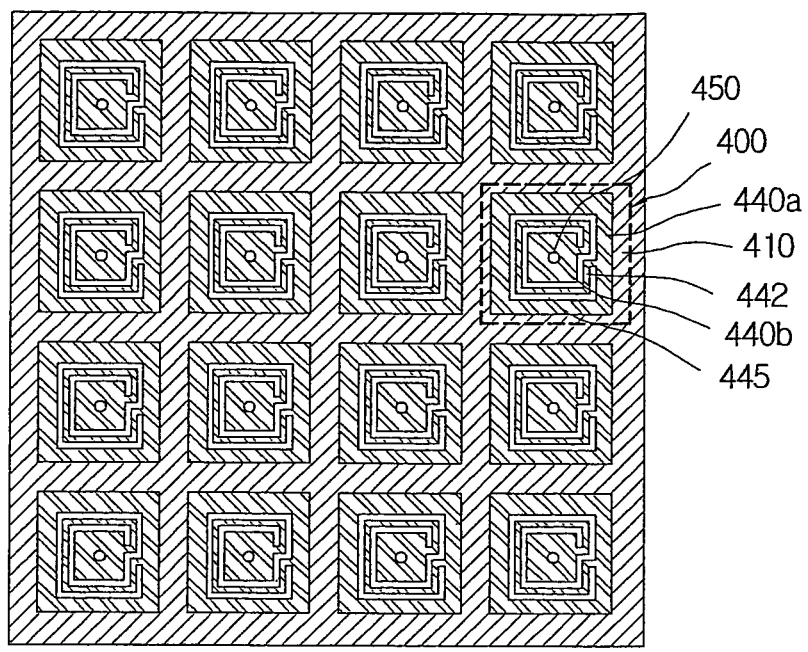
FIG. 13 is a plan view showing the structure in which a plurality of metal plates of the electromagnetic bandgap structure shown in FIG. 12 are arranged.

FIG. 10 is a 3-D perspective view showing an electromagnetic bandgap structure in accordance with another embodiment of the present invention, and FIG. 11 is a plan view showing the structure in which a plurality of metal plates of the electromagnetic bandgap structure shown in FIG. 10 are arranged. FIG. 12 is a 3-D perspective view showing an electromagnetic bandgap structure in accordance with another embodiment of the present invention, and FIG. 13 is a plan view showing the structure in which a plurality of metal plates of the electromagnetic bandgap structure shown in FIG. 12 are arranged.

The electromagnetic bandgap structure 400 can include a first metal layer 410, a second metal layer 420, a first dielectric layer 430a, a second dielectric layer 430b, a first metal plate 440a, a second metal plate 440b and a via 450.

A mushroom type structure 460 can be configured to include the first metal plate 440a having a certain size, a second metal plate 440b, accommodated into a hole 445 which is formed in the first metal plate 440a, and the via 450 having one end part which is connected to the first metal layer 410 and the other end part which is connected to the second metal plate 440b. The first metal plate 440a and the second metal plate 440b can be placed at the same planar surface. An inside wall of the hole 445 of the first metal plate 440a and an outside wall of the edge part of the second metal plate 440b can be away from each other. Accordingly, the inside wall of the first metal plate 440a and the outside wall of the edge part of the second metal plate 440b can be electrically connected to each other through a metal line 442.

The first dielectric layer 430a can be stacked in the first metal layer 410, and the first metal plate 440a and the second metal plate 440b can be stacked in the first dielectric layer 430a. The second dielectric layer 430b can be stacked in the first metal plate 440a, the second metal plate 440b and the first dielectric layer 430a. The dielectric layer 430 can be distinguished into the first dielectric layer 430a and the second dielectric layer 430b according to their formation time. Here, the first metal plate 440a and the second metal plate 440b can be placed between the first dielectric layer 430a and the second dielectric layer 430b.

The first metal layer 410, the second metal layer 420, the first metal plate 440a, the second metal plate 440b and the via 450 can consist of a metal material (e.g. copper) capable of being provided with an electric power and transferred to a signal.

The first dielectric layer 430a and the second dielectric layer 430b can consist of the same dielectric material, but alternatively, the dielectric layer 430a and 430b can consist of materials having different dielectric constants from each other.

If the first meal layer 410 is a ground layer, the second metal layer 420 is a power layer. Also, if the first metal 410 is the power layer, the second layer 420 is the ground layer. In other words, the first metal layer 410 and the second metal layer 420 can be each one of the ground layer and the power layer, which are placed close to each other, and the dielectric layer 430 can be placed between the ground layer and the power layer.

Even though the first metal plate 440a having a regular square shape is illustrated, the first metal plate 440a can have various other shapes such as polygon, circles and ellipses. Similarly, although the second metal plate 440b having a regular square shape is illustrated, the second metal plate 440b can have various other shapes such as polygon, circles and ellipses.

The method of forming the electromagnetic bandgap structure 400 will be described as follows.

The first metal layer 410 and the first dielectric layer 430a can be stacked in.

Then, the via 450 penetrating the first dielectric layer 430a can be formed through the drilling process in order to allow the second metal plate 440b which is supposed to be stacked in the first dielectric layer 430a to be electrically connected to the first metal layer 410.

After the via 450 is formed, the plating process can be performed to allow a plating layer to be formed on an inside wall of the via 450 in order to electrically connect the first metal layer 410 to the second metal plate 440b. According to the plating process, a plating layer can be formed on the inside wall of the via 450 excluding the center part among the inside part of the via 450. Alternatively, the entire inside part of the via 450 can be completely filled. In case that the inside part of the via 450 has an empty center part, the empty center part can be filled with the dielectric material or air. Since the formation of the via 450 is evident to any person of ordinary skill in the art, the pertinent detailed description will be omitted.

In an embodiment of the present invention, after a metal layer is stacked in the first dielectric layer 430a, the first metal plate 440a, the second metal plate 440b and the metal line 442 can be formed through a patterning process. Here, the detailed description related to the patterning process, which can use masking, exposure, etching and development that are typically used to form a circuit pattern in the printed circuit board, will be omitted.

The electromagnetic bandgap structure 400 can be formed by successively stacking the second dielectric layer 430b and the second metal layer 420.

At least one mushroom type structure 460 including the first metal plate 440a, the second metal plate 440b, the metal line 442 and the via 450 can be formed between the first metal layer 410 and the second metal layer 420. A plurality of mushroom type structure 460 can have metal plates arranged on the same planar surface or the different planar surface. Also, the via 450 of the mushroom type structure 460 can face the first metal layer 410. Alternatively, the via 450 of the mushroom type structure 460 can face the second metal layer 420.

In the plurality of mushroom type structures 460, all of the vias 450 can face the first metal layer 410 or the second metal layer 420. Alternatively, the vias 450 of some mushroom type structures 460 can face the first metal layer 410, and the vias 450 of the other mushroom type structures 460 can face the second metal layer 420.

The metal line 442 can have a straight-line shape (refer to FIG. 10) or a spiral shape (refer to FIG. 12). Alternatively, the metal line 442 can have various shapes. Any shapes having one end part, connected to the first metal plate 440a, and the other end part, connected to the second metal plate 440b, can be applied to the present invention.

FIG. 11 or FIG. 13 illustrates that the mushroom type structures 460 is away from each other at predetermined intervals and be repeatedly arranged. The repeated formation of the mushroom type structures 460 can make it possible to block a signal having a frequency band corresponding to an operation frequency band of an analog circuit (e.g. an RF circuit) among an electromagnetic wave proceeding from a digital circuit to the analog circuit.

The mushroom type structures 460 can be not only miniaturized but also have a lower bandgap frequency by connecting the second metal plate 440b connected to the via 450 to the first metal plate 440a by use of the metal line 442 in the mushroom type structures 460.

Figure 14:
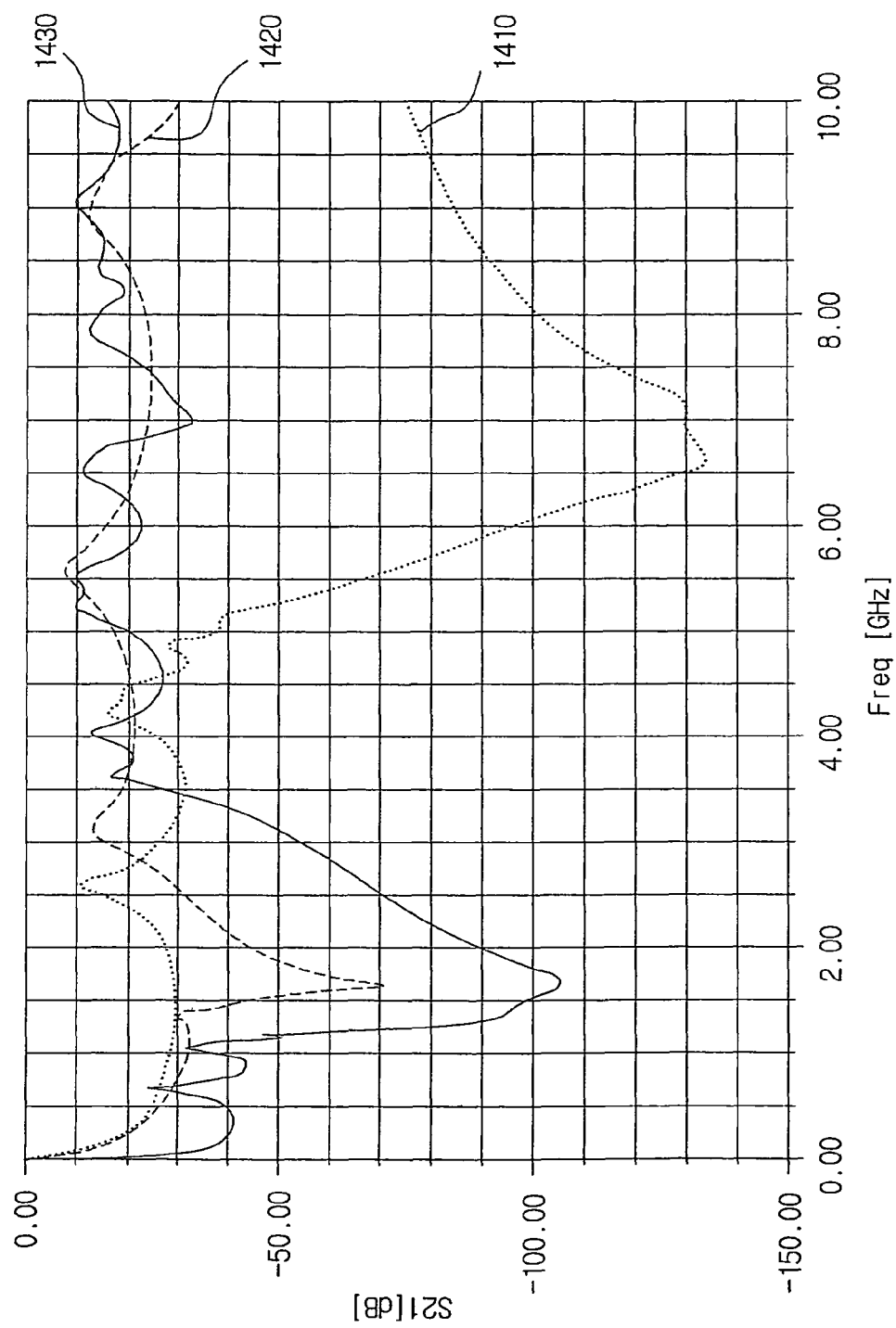
FIG. 14 is graphs showing results that are computer-simulated by using electromagnetic bandgap structures in accordance with a conventional art and another embodiment of the present invention.

FIG. 14 is graphs showing results that are computer-simulated by using electromagnetic bandgap structures in accordance with a conventional art and another embodiment of the present invention.

FIG. 14 illustrates the conventional electromagnetic bandgap structure (i.e. the metal plate 232) having the size of 4 mm$^2$ (2×2) (referring to 1410) and the conventional electromagnetic bandgap structure (i.e. the metal plate 232) having the size of 64 mm$^2$ (8×8) (referring to 1420).

If the structure has the size of 4 mm$^2$ (2×2) (referring to 1410), the frequency having the noise level of (−) 50 dB or lower is 2.0 to 5.5 GHz or higher.

If the structure has the size of 64 mm$^2$ (2×2) (referring to 1410), the frequency having the noise level of (−) 50 dB or lower is 2.0 to 1.5 to 1.8 GHz, and the frequency having the lowest noise level is 1.7 GHz.

In other words, in accordance with the conventional electromagnetic bandgap structure 200, if the bandgap frequency is placed in the band between 0.8 and 2.0 GHz, which is the operation frequency of the RF circuit used in the mobile communication terminal, it is necessary that the structure has the size of 64 mm$^2$ (8×8) (referring to 1420).

However, in accordance with the electromagnetic structure 400 according to another embodiment of the present invention, if the structure has the size of 4 mm$^2$ (2×2) (referring to 1430), the frequency having the noise level of (−) 50 dB or lower can be 1.2 to 3.2 GHz, and the frequency having the lowest noise level can be 1.7 GHz.

This can be charted as shown in the following table 2.

TABLE 2

|  | Bandgap frequency | Structure size | Noise level |
|---|---|---|---|
| Conventional structure | 7.5 GHz | 4 mm$^2$(7 × 7) | (−) 50 dB |
|  | 1.7 GHz | 64 mm$^2$(18 × 18) | (−) 50 dB |
| Structure of invention | 1.7 GHz | 4 mm$^2$(7 × 7) | (−) 50 dB |

In other words, it can be recognized that the electromagnetic bandgap structure 400 accordance with another embodiment of the present invention is able to not only have the same bandgap frequency as the conventional electromagnetic bandgap structure 200 but also lower the structure size by $\frac{1}{16}$ or more (i.e. 64 mm$^2$→4 mm$^2$).

Also, in the case of having the same structure size, it can be recognized that the bandgap frequency is lowered by $\frac{1}{4}$ or more (i.e. 7.5 GHz→1.7 GHz).

The printed circuit board of the present invention can include an analog circuit and a digital circuit. The analog circuit can be the RF circuit such as an antenna receiving a wireless signal from an outside.

In the printed circuit board, the electromagnetic bandgap structures 300 and 400 in accordance with an embodiment (refer to FIG. 6 through FIG. 8) and another embodiment (refer to FIG. 10 through FIG. 13) of the present invention can be arranged between the analog circuit and the digital circuit. In other words, the electromagnetic bandgap structure 300 or 400 can be arranged between the RF circuit 140 and the digital circuit 130 in the printed circuit board as shown in FIG. 1.

In the digital circuit 130, the electromagnetic bandgap structure 300 or 400 can be arranged in order to allow an electromagnetic wave transferred from the digital circuit 130 to the RF circuit 140 to necessarily to pass through the electromagnetic bandgap structure 300 or 400. In other words, the electromagnetic bandgap structure 300 or 400 can be arranged in a closed curve shape about the RF circuit 140 or the digital circuit 130.

Alternatively, the electromagnetic bandgap structure 300 or 400 can be arranged in a signal transferring path between the digital circuit and the analog circuit.

Arranging the electromagnetic bandgap structure 300 or 400 inside the printed circuit board having the analog circuit and the digital circuit that are embodied together therein can make it possible to prevent an electromagnetic wave having a certain frequency band (e.g. 0.8 to 2.0 GHz) among the electromagnetic wave transferred from the digital circuit and the analog circuit from being transferred.

In other words, in spite of the miniaturized size of the structure, the forgoing mixed signal problem can be solved by preventing an electromagnetic wave having a particular frequency band corresponding to noise from being transferred in the RF circuit 140.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

What is claimed is:

1. An electromagnetic bandgap structure, comprising:
a first metal layer;
a first dielectric layer, stacked in the first metal layer;
a metal plate, stacked in the first dielectric layer;
a via, having one end part which is connected to the first metal layer;
a second dielectric layer, stacked in the metal plate and the first dielectric layer; and
a second metal layer, stacked in the second dielectric layer,
whereas the other end part of the via is connected to a via land which is placed in a hole formed in the metal plate, and the via land is connected to the metal plate through a metal line.

2. The electromagnetic bandgap structure of claim 1, the metal line has a straight-line shape, a curved shape or a spiral shape.

3. A printed circuit board having an analog circuit and a digital circuit, the printed circuit board in which an electromagnetic bandgap structure is disposed between the analog circuit and the digital circuit, the electromagnetic bandgap structure comprising:
a first metal layer;
a first dielectric layer, stacked in the first metal layer;
a metal plate, stacked in the first dielectric layer;
a via, having one end part which is connected to the first metal layer;
a second dielectric layer, stacked in the metal plate and the first dielectric layer; and
a second metal layer, stacked in the second dielectric layer,
whereas the other end part of the via is connected to a via land which is placed in a hole formed in the metal plate, and the via land is connected to the metal plate through a metal line.

4. The printed circuit board of claim 3, wherein the first metal layer is any one of a ground layer and a power layer, and the second metal layer is the other.

5. The printed circuit board of claim 3, wherein the analog circuit is an RF circuit including an antenna receiving a wireless signal from an outside.

6. The printed circuit board of claim 3, wherein the metal line has a straight-line shape, a curved shape or a spiral shape.

* * * * *